United States Patent [19]

Carpenter et al.

[11] 4,400,789
[45] Aug. 23, 1983

[54] MAGNETIC HEADING SIMULATOR

[75] Inventors: Dennis O. Carpenter, Bothell; Robert E. Ceola, Auburn, both of Wash.

[73] Assignee: The Boeing Company, Seattle, Wash.

[21] Appl. No.: 192,250

[22] Filed: Sep. 30, 1980

[51] Int. Cl.³ .......................... G06F 15/20; G06J 1/00
[52] U.S. Cl. ..................................... 364/578; 364/579; 73/1 E
[58] Field of Search ............... 364/167, 183, 571, 578, 364/579; 73/1 E; 235/92 CA, 92 CV, 92 PE; 33/356; 318/601

[56] References Cited

U.S. PATENT DOCUMENTS

| | | | |
|---|---|---|---|
| 3,167,665 | 1/1965 | Godby et al. | 307/106 |
| 3,253,342 | 5/1966 | Depp | 33/316 |
| 3,261,970 | 7/1966 | Snyder | 364/801 |
| 3,266,052 | 8/1966 | Yamron | 73/1 E |
| 3,448,360 | 6/1969 | Pohl | 318/601 |
| 3,539,895 | 11/1970 | McGee | 318/601 X |
| 3,582,751 | 6/1971 | Rosshirt et al. | 318/601 X |
| 3,719,812 | 3/1973 | Bishop et al. | 364/579 |
| 3,725,691 | 4/1973 | Delaunay | 364/457 |
| 3,746,842 | 7/1973 | Fowler | 235/92 CV |
| 3,752,969 | 8/1973 | Kiffmeyer et al. | 318/601 |
| 3,793,511 | 2/1974 | Bala et al. | 364/167 |
| 4,031,630 | 6/1977 | Fowler | 33/356 |
| 4,091,543 | 5/1978 | Lapeyre | 33/356 |
| 4,124,897 | 11/1978 | Martin | 364/571 |
| 4,134,217 | 1/1979 | Neilson | 364/578 |
| 4,143,467 | 3/1979 | Erspamer et al. | 33/356 |
| 4,227,072 | 10/1980 | Fancy et al. | 235/92 CA |

FOREIGN PATENT DOCUMENTS 55-61876  5/1980  Japan ..................... 364/578

Primary Examiner—Felix D. Gruber
Attorney, Agent, or Firm—Christensen, O'Connor, Johnson & Kindness

[57] ABSTRACT

A magnetic heading signal simulator that simulates the analog electrical signals representative of magnetic heading produced by a conventional flux value of an aircraft and provides the simulated signals to the magnetic heading reference system of the aircraft for test purposes receives digitally-encoded information representative of a desired value of heading and a rate at which that heading is to be reached. The simulator includes a logic circuit that receives the digital heading information from a programmable digital computer and assembles the heading value information in a form compatible with the input of a digital-to-synchro converter in accordance with the provided rate information. The digital-to-synchro converter decodes the digital information and provides an output simulative of a three-wire synchro signal representative of the desired heading value. The digital-to-synchro conversion circuitry also includes circuitry for developing an excitation signal compatible with the aircraft magnetic heading reference system and simulative of the excitation signal provided by the aircraft's flux valve.

10 Claims, 6 Drawing Figures

MAGNETIC HEADING SIMULATOR

BACKGROUND OF THE INVENTION

This invention relates to magnetic heading simulators and, more particularly, to a fully automated magnetic heading reference simulator for use with aircraft navigation systems.

A necessary part of any instrumentation in an aircraft in order to navigate that aircraft is a compass. Most aircraft contain compasses which are of the magnetic type utilizing the magnetic field of the earth to determine the heading of the aircraft. In normal flight conditions the compass is slaved to the magnetic heading as determined by a flux valve sensitive to the earth's magnetic field. The flux valve in many aircraft is located in the wing tip. Some compasses can be unslaved from the magnetic heading and slaved to the directional gyros present in the aircraft navigation system. In this case, the gyros can be used to drive the compass to any heading desired in the case of testing and maintenance regardless of the actual heading of the airplane. However, on many aircraft the compass cannot be unslaved from the flux valve and, therefore, up until the present time the heading reference system had to be tested at whatever the actual heading of the aircraft was when it was parked at the test facility.

Testing of the heading system in a static condition at a single heading is undesirable since it really does not check the system under dynamic conditions and problems which are present during the dynamic change from one heading to another or at certain headings other than the one at which the tests were conducted might not be detected during testing at a single fixed heading. Consideration has been given to developing equipment which would provide a simulated magnetic field which could then be placed in the vicinity of the flux valve of the aircraft and varied to develop magnetic fields simulating many different and changing headings for test purposes. However, the location of the flux valve in the wing of the aircraft makes the development and use of such equipment impractical.

It is therefore an object of the present invention to provide apparatus for simulating magnetic heading for purposes of test and evaluation of the heading reference system.

It is an object of this invention to provide such a magnetic heading simulation that utilizes as much as possible of the existing circuitry of the aircraft so that the system can be tested from end-to-end rather than piecemeal.

It is a further object of this invention to provide a heading simulator which can be operated under programmed computer control so that headings and heading rates can be fed into the system automatically.

SUMMARY OF THE INVENTION

According to the above-stated objects, apparatus is provided which simulates the analog electrical signals representative of magnetic heading normally produced by the flux valve of an aircraft and feeds the simulated magnetic heading representative information to the magnetic heading reference system of the aircraft so that the magnetic heading reference system circuitry and instrumentation of the aircraft can be tested without physically moving the aircraft. The simulation apparatus receives digitally-encoded information representative of a desired value of heading and a rate at which that value of heading is to be approached. The digital information in the preferred system is provided by a computer programmed to provide such information automatically. The digital heading information is received by a logic circuit which assembles the heading value information in a form compatible with a digital-to-synchro converter and gates that information to the the digital-to-synchro converter in accordance with the prescribed rate information. The digital-to-synchro converter decodes the digital information and provides an analog output simulative of a three-wire synchro signal and representative of the desired heading value. The digital-to-synchro converter is coupled to the magnetic heading reference system of the aircraft and is compatible therewith.

The digital-to-synchro conversion circuitry also includes circuitry for developing an excitation signal compatible with the magnetic heading reference system and simulative of the excitation signal provided by the flux valve of the aircraft.

BRIEF DESCRIPTION OF THE DRAWINGS

The invention disclosed herein will be better understood by those of ordinary skill in the art upon reading the ensuing specification in conjunction with the attached drawings wherein.

DETAILED DESCRIPTION OF THE PREFERRED EMBODIMENT

Figure 1:
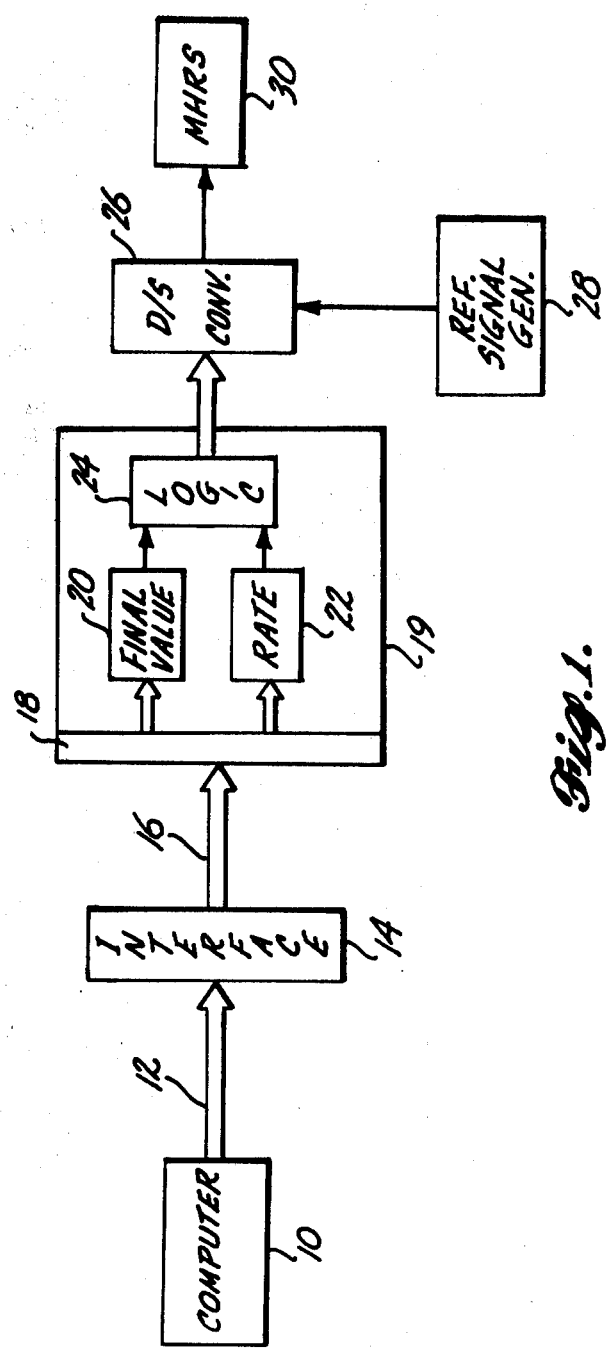
FIG. 1 is a block diagram of a magnetic heading simulator system made in accordance with the principles of the present invention.

FIG. 1 is a block diagram of a magnetic heading simulator system utilizing a programmable digital computer as a source of digitally encoded information representative of a desired magnetic heading and also representative of a rate at which that heading is to be approached. The computer 10 is programmed to produce digital signals which represent various headings for input to the magnetic heading reference system in order to test the system. The computer also provides information representative of the rate at which the various desired heading values are to be approached and the direction of approach in order to provide the capability of a dynamic test of the heading reference system. In other words, the information provided by the computer simulates a condition in which the aircraft is actually changing heading as if it were performing maneuvers and provides the capability for test personnel to evaluate the operation of the magnetic heading reference system under simulated flight conditions. The computer can be any one of several programmable digital computers and in the illustrated and preferred embodiment comprises a Hewlett-Packard type 9845 computer, which is a commercially available unit. The heading value and rate data is provided by the computer 10 under program control over the data bus 12. Given the information disclosed herein and further, given the fact that the purpose of the present system is to provide a simulated heading value and rate of attainment, it would be well-known to one of ordinary skill in the art how to program the computer in a reasonable amount of time to provide the proper signals to satisfactorily evaluate the static and dynamic operation of the magnetic heading reference system of an aircraft. Therefore, the details of programming the 9845 computer will not be set forth herein.

The output bus 12 of the type 9845 computer is comprised of sixteen lines, eight containing data and eight for control signals. The output information of the computer is fed on output bus 12 to an interface circuit 14. The interface 14 assembles the data from several successive words generated by the computer to provide a meaningful display of information to the logic circuitry and digital-to-synchro converter. Interface 14 is preferably a commercially available Fairchild Model 4880 instrument coupler. The coupler assembles the data from the computer into a 40-bit word available for parallel transfer on output bus 16. The 40-line output bus 16 is coupled to the input bus 18 of the digital circuitry generally designated as 19. The actual digital simulator circuitry utilizes only twenty-four of the forty available output lines from the interface 14. Eight of the data lines, specifically lines 7 through 14, contain information representative of the rate at which the desired heading value is to be approached. Lines 15 through 28 contain a 14-bit data word representative of the desired heading value generated by the computer. Line 29 contains information relating to the direction in which the desired heading value is to be approached, either the counterclockwise or clockwise direction, and line 33 carries a transfer pulse generated by the computer and used by the circuitry to gate the rate and final value information from the interface 14 to the circuitry 19.

The rate information is fed to a rate register 22 and the desired heading value information is fed to a final value register 20. From these registers the information is presented to a logic circuit 24 which updates the present information available in accordance with the rate, direction and final value information received from the computer and then passes that information to the digital-to-synchro converter 26. The digital-to-synchro converter receives an excitation signal from the analog reference signal generator 28 in order to present a compatible output to the conventional magnetic heading reference system of the aircraft designated by circuit block 30 for purposes of illustration.

Figure 2A:
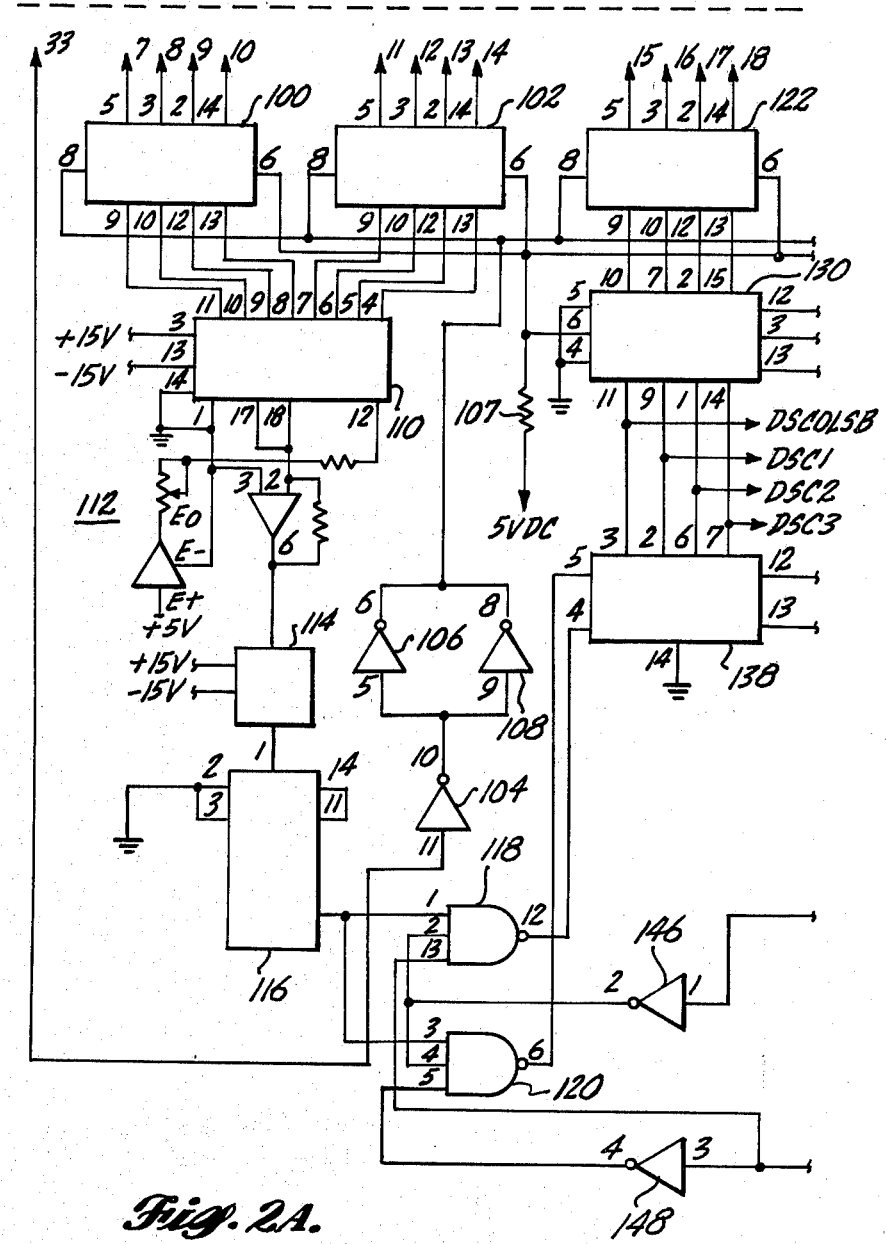
FIGS. 2A and 2B taken together form a detailed schematic diagram of the digital logic circuit which interfaces between the source of simulated heading digital information and the digital-to-synchro converter.
Figure 2B:
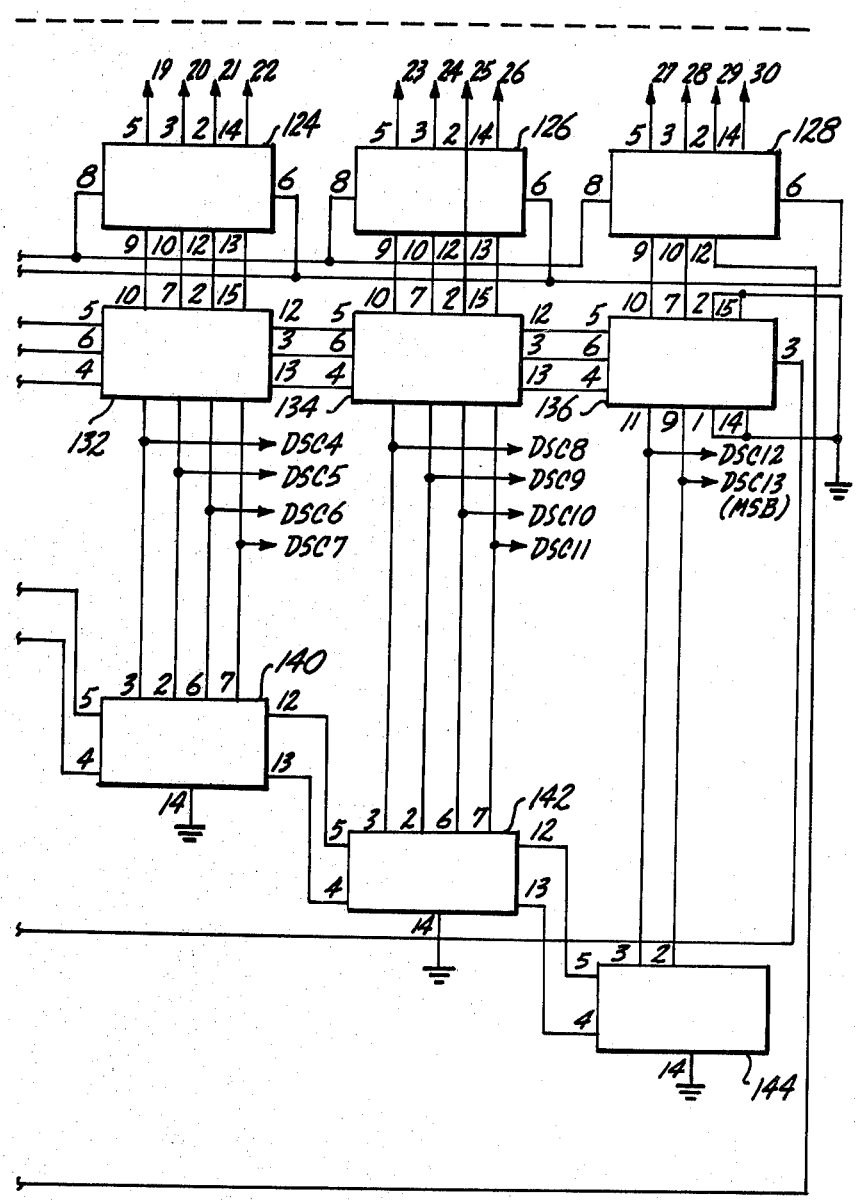

FIGS. 2A and 2B taken together form a detailed schematic diagram of the circuitry contained in blocks 20, 22 and 24 of FIG. 1. The rate register 22 is comprised of two 4-bit storage registers 100 and 102. The eight bits of rate information are received at the input pins of registers 100 and 102 from lines 7 through 14 of the output bus of the interface 14. A transfer pulse is received from the computer on line 33 of the bus 16 and is fed to the input pin 11 of an inverter 104. The transfer pulse is a high level at the input of the inverter 104 and is transmitted as a low from the output pin 10 of the inverter to the input pins 5 and 9, respectively, of two inverters 106 and 108. The inverters 106 and 108 are provided to increase the fan-out capability of the transfer signal. The high output of pins 6 and 8, respectively, of inverters 106 and 108 is coupled to pin 8 of each of the storage registers 100 and 102. The high input at pin 8 of the storage registers causes transfer of information present at the input pins of the storage registers to the output pins of the storage registers. In the preferred embodiment the storage registers are type 74 L 95 integrated circuits and can be operated in either a parallel or serial transfer mode. Pin 6 of each of the storage registers is coupled to the 5-volt DC supply through a resistor 107 and this input at pin 6 of the registers causes the registers to operate in a parallel transfer mode so that upon reception of the transfer pulse at pins 8 of the respective register the transfer of information from the input to the output of the storage register is accomplished in parallel mode. The transfer pulse is an internally generated signal from the computer and is generated approximately ten microseconds after the 40-bit output word is assembled by the interface unit 14 and is available on its output bus. The ten-microsecond delay permits the data to settle prior to its transfer to the remaining circuitry.

The digital rate information present at the output pins of storage registers 100 and 102 is fed to the input pins of a digital-to-analog converter 110, preferably a DAC-82 integrated circuit, commercially available from the Burr-Brown corporation. The circuitry generally designated as 112 coupled to the output side of the digital-to-analog converter 110 is conventional circuitry for zero balancing and reference adjust of the analog output signal which is representative of the rate information generated by the computer 10. The analog signal output of the digital-to-analog converter 110 is coupled to the input of a voltage-to-frequency converter 114 which in the preferred embodiment is a VFC-12 integrated circuit, available from the Burr-Brown corporation. The voltage-to-frequency converter 114 translates the analog signal representative of the rate information into a signal having a frequency representative of the analog signal and, therefore, representative of the rate information. The output of the voltage-to-frequency converter is coupled to a divide-by-ten circuit 116 which comprises in the preferred embodiment a 7490-type integrated circuit. The signal from the voltage-to-frequency converter is therefore divided by ten and appears as a pulse train at the output pin 12 of the divide-by-ten circuit 116. The pulse train output from the divide-by-ten circuit is coupled to pin 1 of NAND gate 118 and pin 3 of NAND gate 120 and provides a pulse count for updating information being sampled by the digital-to-synchro converter 26, as will be explained further below.

The 14-bit data word representative of the final desired value of heading is present on lines 15 through 28 of the output bus 16 and is present at the inputs of a series of four storage registers 122, 124, 126 and 128. These storage registers are identical to the storage registers 100 and 102 and are placed in the parallel data transfer mode by having input pins 6 of each of the registers tied to the 5-volt DC supply through resistor 107. The input pin 8 of each of the registers is tied to the output of inverters 106 and 108 and receives a transfer pulse from the computer such that upon reception of each transfer pulse data is transferred in parallel from the input to the output of the storage registers. The output of the storage registers 122 through 128 is tied to one side of a comparator chain comprised of comparators 130, 132, 134 and 136. The other side of the comparator is tied to binary counters 138, 140, 142 and 144. The output lines of the binary counters 138 through 144 are continuously monitored by the input of the digitalto-synchro converter 26; therefore, whatever value of heading is represented by the digital data present on the output lines of the binary counters 138 through 144 is seen by the digital-to-synchro converter 26 as being the present value of heading to be acted upon and transferred to the magnetic heading reference system. The comparator chain 130 through 136 is wired so that the data word present at the outputs of the storage registers 122 to 128 is compared to the data word present in the binary counters 138 through 144 and only when the two data words are equal does the output of comparator 136 pin 3 become high. For all other conditions the output at comparator 136 pin 3 is a low level. The output of pin 3 is coupled to the input pin 2 of NAND gate 118 and the input pin 4 of NAND gate 120 through an inverter 146. Therefore, when the output of pin 3 of comparator 136 is at a low level, the level at pin 2 of NAND gate 118 and at pin 4 of NAND gate 120 will be high. The comparators 130 through 136 in the preferred embodiment are type 74 L 85 integrated circuits. The direction of approach to the desired final value of heading from the present heading value present in binary counters 138 through 144 is determined by a sign bit present on line 29 of the data bus 16. If the sign bit is a low level at input, there is a low level at pin 2 of storage register 128. Upon reception of a transfer pulse at pin 8 this low level is transferred to the output pin 12 of the storage register 128. This low level is coupled directly to the input pin 13 of NAND gate 118 and causes the output at pin 12 of NAND gate 118 to be high. This high signal is coupled directly to the down count input pin 4 of binary counter 138 thereby enabling the counter to count up. The low level signal from pin 12 of storage register 128 is also coupled through an inverter 148 to the input pin 5 of NAND gate 120. The presence of the high level at input pin 5 of NAND gate 120 enables the gate 120 so that it gates the count pulses from the divide-by-ten circuit 116 to the count up input pin 5 of binary counter 138. Binary counters 138, 140, 142 and 144 are preferably of the type 74 LS 193 integrated circuit.

Similarly, if the final value of heading is to be approached from the opposite direction and is counterclockwise, the level on data bus line 29 will be high and the output of the storage register 128 pin 12 will also be high. The high level will be passed directly to pin 13 of NAND gate 118 and the high will be inverted to a low level by inverter 148 and applied as a low level to pin 5 of NAND gate 120, thereby causing the output at pin 6 of NAND gate 120 to be high. This high signal is coupled directly to pin 5 of counter 138 thereby enabling the counter to count down. The high level signal at pin 13 of NAND gate 118 enables NAND gate 118 to pass the count pulses to the count down input pin 4 of counter 138, causing the counter 138 to count down at the rate of the count pulses produced by divide-by-ten circuit 116. The count up or count down of the counters 138 through 144 continues until such time as the present value in the counters exactly equals the desired final value stored in the registers 122 to 128, at which time the output of pin 3 of comparator 136 is driven high and as inverted through inverter 146 is applied to NAND gates 118 and 120 and eliminates the count up or count down signal to the counters 138 through 144.

The count present in counters 138 through 144 is continuously monitored by digital-to-synchro converter 26 which, in the preferred embodiment, is a DSC 40-L-IS circuit board available commercially from Computer Conversions Corp., East Northport, N.Y.

Figure 3A:
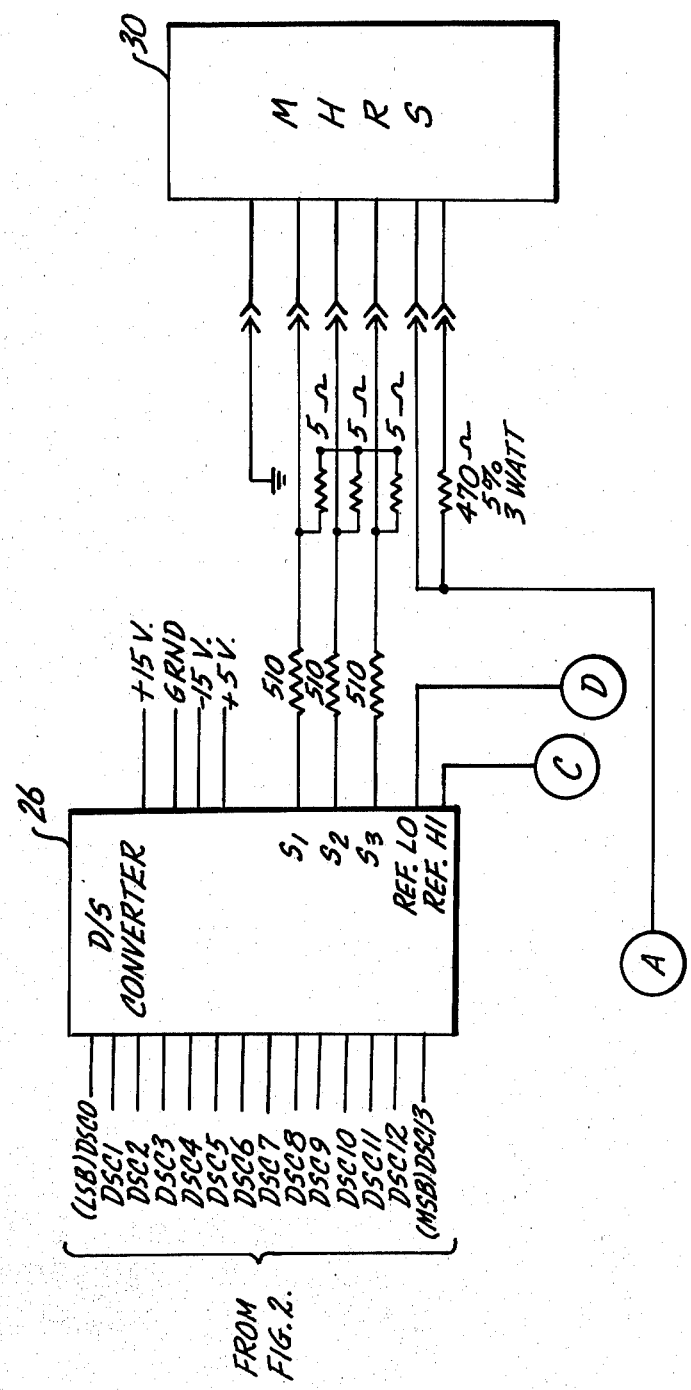
FIGS. 3A, 3B and 3C taken together form a detailed schematic diagram of a digital-to-synchro conversion network made in accordance with the principles of the present invention including the circuitry necessary to provide excitation signals compatible with the magnetic heading reference system.
Figure 3B:
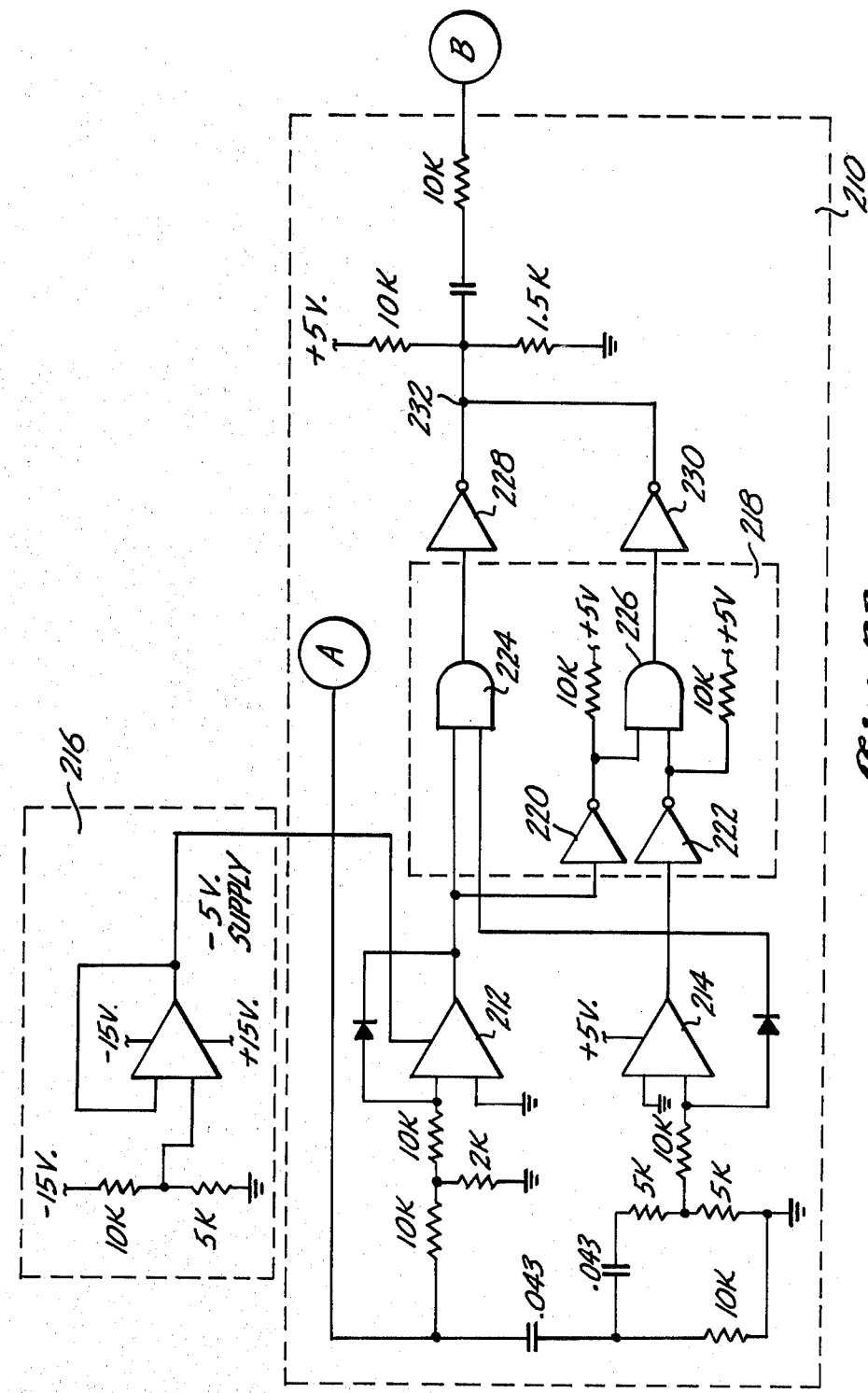
Figure 3C:
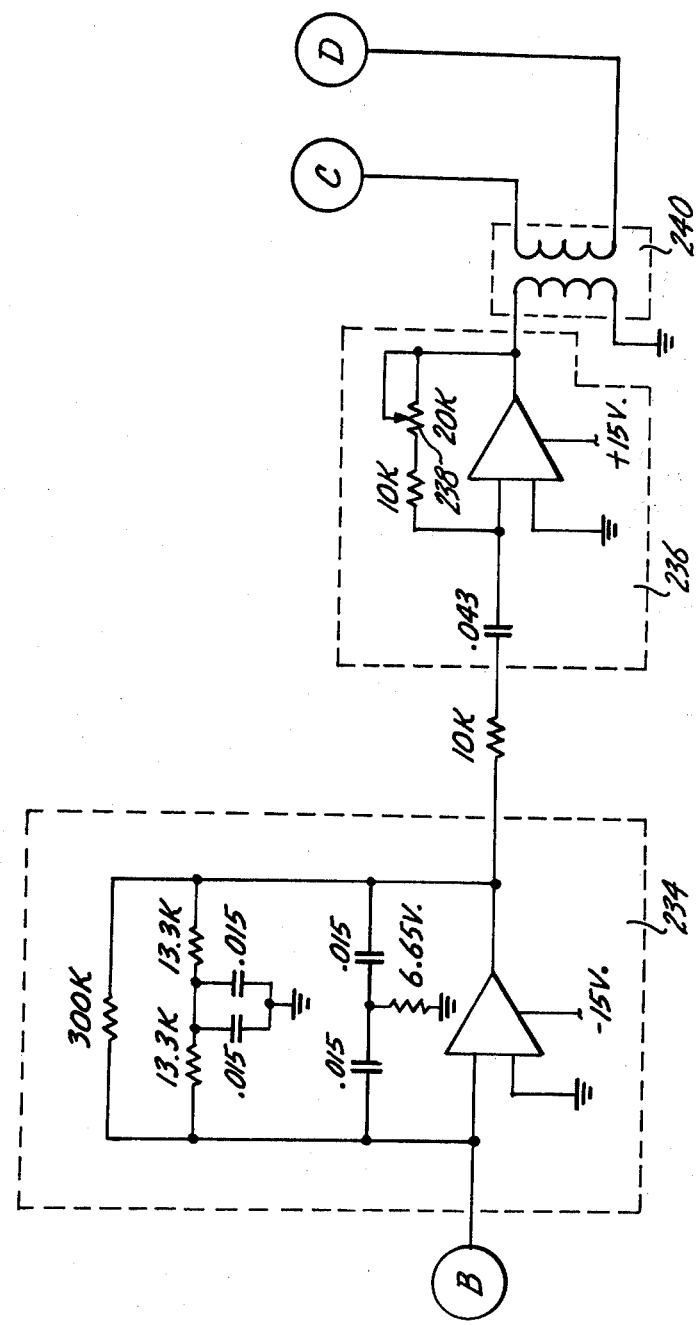

The digital-to-synchro converter 26 converts the digital input word comprised of bits 1 through 14 to an analog signal representative of the S1, S2 and S3 windings of a synchro to simulate the flux valve output. Typically, the flux valve output is an 800 Hertz signal and therefore it is necessary to provide an 800 Hertz excitation at the signal REF LO and REF HI inputs of the digital-to-synchro converter 26 in order to provide a compatible output for use with the magnetic heading reference system of the aircraft without further modification to that system. FIGS 3A, 3B and 3C contain the detailed schematic diagram of the circuit used to provide a 26-volt 800 Hertz reference signal to the digital-to-synchro converter.

A normal operation of the magnetic heading reference system with the typical flux valve installed in the aircraft is to provide the flux valve with a 400 Hertz reference voltage. Circuitry internal to the flux valve converts this 400 Hertz reference to an 800 Hertz signal and the three-wire synchro output of the flux valve is normally an 800 Hertz signal. Since in the simulator system disclosed herein the flux valve is not used it is necessary to provide circuitry which transforms the 400 Hertz reference available from the magnetic heading reference system into an 800 Hertz excitation to drive the digital-to-analog converter 26 so that the simulated three-wire synchro output from the digital-to-synchro converter 26 is an 800 Hertz signal identical to the type of signal provided by the flux valve.

The 23.2 volt AC 400 Hertz reference voltage is routed from the magnetic heading reference system to a doubler circuit generally designated as 210 comprised of a pair of operational amplifiers 212 and 214. The operational amplifier 214 receives a +5 volt DC signal from the normal 5 volt DC power supply. The operational amplifier 212 receives a −5 volt input from an operational amplifier circuit 216 which provides a −5 volt supply. The output of operational amplifiers 212 and 214 is coupled to a gating circuit generally designated as 218 comprised of two inverters 220 and 222 and a pair of AND gates 224 and 226. In a preferred embodiment the inverters 220 and 222 are type 7416 integrated circuits and the AND gates 224 and 226 are type 5408 integrated circuits. The outputs of both sides of the gating circuit 218 are passed through their respective inverters 228 and 230 and are coupled together at junction 232. The signal appearing at junction 232 is an 800 Hertz square wave. The doubler circuit 210 is designed so that the zero crossing points of the 800 Hertz square wave at junction point 232 match with the zero crossing points of the 400 Hertz reference signal received from the magnetic heading reference system. In particular, every other zero crossing point of the 800 Hertz square wave at junction 232 matches a zero crossing point of the 400 Hertz input reference signal. The 800 Hertz square wave from the doubler circuit is then passed through a twin T selective amplifier 234 which is tuned such that the gain of the amplifier is maximum at 800 Hertz. The output of this twin T selective amplifier 234 is an 800 Hertz sine wave which is then fed to a final amplifier stage 236. The amplifier 236 has a scale setting potentiometer 238 connected to the output thereof so that the output of the amplifier circuit can be adjusted to provide sufficient gain to drive the digital-to-synchro converter 26. The output of the doubler amplifier circuit is coupled to the primary of an output transformer 240. The secondary of the output transformer is connected to the REF LO and REF HI inputs of the digital-to-synchro 26 and the signal at the reference inputs of the digital-to-synchro converter is a 26 volt 800 Hertz sine wave with the zero crossing points matched to the zero crossing points of the original 400 Hertz reference received from the magnetic heading reference system.

The digital-to-synchro converter 26 monitors the 14-bit digital output of the binary counters 138 through 144. Each bit of the digital information represents an angular value of simulated magnetic heading. The weight given to each bit of the digital word by the digital-to-synchro converter is a function of the particular converter used. The output data from the computer or other source of simulated heading information must be developed to match the weighting given to the bits of information by the digital-to-synchro converter. The output of the digital-to-synchro converter on the S1, S2 and S3 output pins is a simulated three-wire synchro output representative of the desired final value of heading as developed by the computer 10. The output passes through a resistor divider network which scales down the output from the digital-to-synchro converter so that a signal of 100 millivolts maximum appears between any two legs of the three-wire synchro output. This 100 millivolt maximum 800 Hertz output signal is identical to the output which would be received from the flux valve and is entirely compatible with the magnetic reading reference system inputs.

In summary therefore, a heading simulator system is provided which accepts digital data from a computer or other source, such digital data being representative of a desired value of heading and a rate at which that value of heading is to be reached. The digital information is operated on by a logic circuit and the output of the logic circuit is monitored by a digital-to-synchro converter which converts the digital output of the logic circuit into a three-wire synchro output. The logic circuit functions to update the value of heading presently being provided to the digital-to-synchro converter at a rate in accordance with the information received by the logic circuit until a desired final value of heading is reached. The system also includes a reference signal generator circuit which transforms the 400 Hertz reference supplied by the magnetic heading reference system of the aircraft into a suitable 800 Hertz excitation signal which drives the digital-to-synchro converter, thereby permitting the digital-to-synchro converter to develop an 800 Hertz three-wire synchro output which is compatible with the magnetic heading reference system input and which is identical to the type of signal which would be received from the flux valve.

While a preferred embodiment of the invention has been illustrated and described herein, it will be obvious to those of ordinary skill in the art and others that several modifications can be made to the circuitry described and illustrated herein while still remaining within the spirit and scope of the present invention. For example, the preferred embodiment has been described in terms of TTL logic and the representative integrated circuit part numbers and resistor and capacitor values have been given with that preferred embodiment in mind. However, it would be entirely possible to use some other form of logic other than TTL to perform the same functions necessary to the working of the present invention. The resistor and capacitor values are also subject to variation depending on what circuits are actually used to perform the functions of the invention. Further, the preferred source of the digitally encoded information representation of heading and rate has been described as a programmable digital computer to automatically supply such signals. The digital heading source could however be some other means such as a switch box or other circuit manually operable to provide such signals. Therefore, the invention disclosed herein is to be defined solely by reference to the appended claims.

The embodiments of the invention to which an exclusive property or privilege is claimed are defined as follows:

1. A magnetic heading simulator system for producing a signal representative of a value of magnetic heading and simulative of a signal produced by a conventional flux valve, said magnetic heading simulator system comprising:
   first means for producing a first word of digital data, at least a first portion of which is representative of a desired value of magnetic heading;
   first register means coupled to said first means for receiving and holding said first portion of said first word of digital data;
   counter means containing a count representative of a present value of magnetic heading;
   logic means coupled to said first register means and said counter means and operable to update said count in said counter means such that said count is equal to said first portion of said first word of digital data;
   digital-to-analog converter means coupled to said counter means for receiving said count and converting said count to an analog signal representative of said desired value of magnetic heading, said analog signal being simulative of the signal produced by a conventional flux valve.

2. The magnetic heading simulator system of claim 1 wherein said first means comprises a programmable digital computer.

3. The magnetic heading simulator system of claims 1 or 2 wherein said logic means includes:
   comparator means coupled to said first register means and said counter means for comparing said first portion of said first word of digital data with said count and operable to produce a stop count signal representative of a condition in which said first portion of said first word of digital data equals said count;
   control means coupled to said counter means and said comparator means for producing a counter control signal to control said counter means to count up or count down in response to said counter control signal, said control means being operable to produce said counter control signal in response to the absence of said stop count signal.

4. The magnetic heading simulator system of claim 3 wherein a second portion of said first word of digital data is representative of a rate at which said desired value of heading is to be reached and wherein further said control means includes:
   second register means for receiving and holding said second portion of said first word of digital data;
   gating means coupled to said second register means and to said counter means for gating said second portion of said first word of digital data to said counter.

5. A magnetic heading simulator system for producing a signal representative of a value of magnetic heading and simulative of a signal produced by a conventional flux valve, said magnetic heading simulator system comprising:

first means for producing a first word of digital data, at least a first portion of which is representative of a desired value of magnetic heading;

first register means coupled to said first means for receiving and holding said first portion of said first word of digital data;

counter means containing a count representative of a present value of magnetic heading;

logic means coupled to said first register means and said counter means and operable to update said count in said counter means such that said count is equal to said first portion of said first word of digital data;

digital-to-analog converter means coupled to said counter means for receiving said count and converting said count to an analog signal representative of said desired value of magnetic heading, said digital-to-analog converter means including a digital-to-synchro converter for producing an analog signal simulative of a three-wire synchro, and reference signal generation means coupled to said digital-to-synchro converter to provide a reference signal to said digital-to-synchro converter to enable said digital-to-synchro converter output to be simulative of a flux valve.

6. The magnetic heading simulator system of claim 5 wherein said first means comprises a programmable digital computer.

7. The magnetic heading simulator system of claim 5 or 6 wherein said logic means includes:

comparator means coupled to said first register means and said counter means for comparing said first portion of said first word of digital data with said count and operable to produce a stop count signal representative of a condition in which said count equals said first word of digital data;

control means coupled to said counter means and said comparator means for producing a counter control signal to control said counter means to count up or count down in response to said counter control signal, said control means being operable to produce said counter control signal in response to the absence of said stop count signal.

8. The magnetic heading simulator system of claim 7 wherein a second portion of said first word of digital data is representative of a rate at which said desired value of heading is to be reached and wherein further said control means includes:

second register means for receiving and holding said second portion of said first word of digital data; and, gating means coupled to said second register means and to said counter means for gating said second portion of said first word of digital data to said counter.

9. The magnetic heading simulator system of claim 5 wherein said simulator system is installed in an aircraft having a magnetic heading reference system that produces a 400 Hertz reference voltage and wherein further said reference signal generator means is coupled to said magnetic heading reference system of said aircraft and receives said 400 Hertz reference voltage from said magnetic heading reference system of said aircraft and converts said 400 Hertz reference voltage to an 800 Hertz excitation voltage for transmission to the digital-to-synchro converter.

10. The magnetic heading simulator system of claim 9 wherein said reference signal generator means includes:

frequency doubler means for receiving said 400 Hz reference voltage signal from said magnetic heading reference system and producing an 800 Hertz signal;

twin T active filter means coupled to the output of said frequency doubler, said twin T active filter being tuned for maximum gain at 800 Hertz; and, amplifier means coupled to the output of said twin T active filter, said amplifier means having a variable gain, the output of said amplifier means being coupled to said digital-to-synchro converter.

* * * * *